US012771325B2

(12) United States Patent
Wu et al.

(10) Patent No.: US 12,771,325 B2

(45) Date of Patent: Oct. 20, 2026

(54) HIGH- AND LOW-PASS NETWORK CIRCUIT WITH INTEGRATED AMPLITUDE-PHASE REGULATION AND CONTROL METHOD THEREOF

(71) Applicant: 38TH RESEARCH INSTITUTE, CHINA ELECTRONICS TECHNOLOGY GROUP CORPORATION, Hefei (CN)

(72) Inventors: Shiwei Wu, Hefei (CN); Dongwei Pang, Hefei (CN); Hongliang Zhao, Hefei (CN); Yongtao Liu, Hefei (CN); Xiaohu Wang, Hefei (CN); Laifu Jin, Hefei (CN); Kun Wang, Hefei (CN); Kun Fang, Hefei (CN); Zongming Duan, Hefei (CN); Yongfeng Gui, Hefei (CN)

(73) Assignee: 38TH RESEARCH INSTITUTE, CHINA ELECTRONICS TECHNOLOGY GROUP CORPORATION, Hefei (CN)

( * ) Notice: Subject to any disclaimer, the term of this patent is extended or adjusted under 35 U.S.C. 154(b) by 0 days.

(21) Appl. No.: 19/260,278

(22) Filed: Jul. 3, 2025

(65) Prior Publication Data

US 2025/0337392 A1 Oct. 30, 2025

Related U.S. Application Data

(63) Continuation of application No. PCT/CN2023/128322, filed on Oct. 31, 2023.

(30) Foreign Application Priority Data

Sep. 26, 2023 (CN) ........................ 202311259844.3

(51) Int. Cl.
*H03H 11/20* (2006.01)
*H03H 11/04* (2006.01)

(52) U.S. Cl.
CPC ......... *H03H 11/20* (2013.01); *H03H 11/0472* (2013.01)

(58) Field of Classification Search
CPC ..... H03H 11/20; H03H 11/0472; H03H 11/16
See application file for complete search history.

(56) References Cited

U.S. PATENT DOCUMENTS

2008/0100399 A1 5/2008 Atsumo et al.
2011/0304409 A1* 12/2011 Tamura .................. H03H 11/20 333/139
2022/0231391 A1* 7/2022 Wang ........................ H03H 7/20

FOREIGN PATENT DOCUMENTS

CN 202839906 U 3/2013
CN 109616723 A 4/2019
(Continued)

OTHER PUBLICATIONS

Shouli Zhou et al., "Design of X-Band Wideband Multi-Function Chip with Phase and Amplitude Control", Journal of University of Electronic Science and Technology of China, vol. 49, No. 5, Sep. 30, 2020, pp. 680-689.
(Continued)

*Primary Examiner* — Andrea Lindgren Baltzell
*Assistant Examiner* — Kimberly E Glenn

(57) ABSTRACT

A high- and low-pass network circuit with integrated amplitude-phase regulation, including a high- and low-pass network phase-shift unit circuit and amplitude modulation unit subcircuits each including an amplitude modulation switch transistor and a resistor connected in parallel. The high- and low-pass network phase-shift unit circuit includes high-pass and low-pass network subcircuits. A first end of the high-pass network subcircuit is connected to a first end of the
(Continued)

low-pass network subcircuit through phase modulation switch transistors M1 and M3. A second end of the high-pass network subcircuit is connected to a second end of the low-pass network subcircuit through phase modulation switch transistors M2 and M4. Body ends of M1 and M2 are connected through two amplitude modulation unit subcircuits. Body ends of M3 and M4 are connected through another two amplitude modulation unit subcircuits. A method for controlling such network circuit is also provided.

10 Claims, 8 Drawing Sheets

(56) References Cited

FOREIGN PATENT DOCUMENTS

| | | | | | |
|---|---|---|---|---|---|
| CN | 110854482 A | | 2/2020 | | |
| CN | 112201961 A | | 1/2021 | | |
| CN | 113452330 A | | 9/2021 | | |
| CN | 113794453 A | | 12/2021 | | |
| CN | 114124184 A | | 3/2022 | | |
| CN | 114665908 A | | 6/2022 | | |
| CN | 115765679 A | | 3/2023 | | |
| JP | 2000013186 A | | 1/2000 | | |
| JP | 2006019823 A | * | 1/2006 | ............... | H03H 9/66 |
| JP | 2008252833 A | | 10/2008 | | |
| KR | 20090020480 A | * | 2/2009 | ................ | H01P 1/18 |
| WO | 0122581 A1 | | 3/2001 | | |

OTHER PUBLICATIONS

Qi Wang et al., "Design and Implementation of X-Band Large Bit High-Low Pass Phase Shifter MMICs", Semiconductor Technology, vol. 41, No. 9, Sep. 3, 2016, pp. 669-673.

* cited by examiner

HIGH- AND LOW-PASS NETWORK CIRCUIT WITH INTEGRATED AMPLITUDE-PHASE REGULATION AND CONTROL METHOD THEREOF

CROSS-REFERENCE TO RELATED APPLICATIONS

This application is a continuation of International Patent Application No. PCT/CN2023/128322, filed on Oct. 31, 2023, which claims the benefit of priority from Chinese Patent Application No. 202311259844.3, filed on Sep. 26, 2023. The content of the aforementioned application, including any intervening amendments made thereto, is incorporated herein by reference in its entirety.

TECHNICAL FIELD

This application relates to electronic circuit design, and more particularly to a high- and low-pass network circuit with integrated amplitude-phase regulation and a control method thereof.

BACKGROUND

High-precision phase shift and attenuation circuits have been widely used in electronic systems such as phased array systems and broadband electronic countermeasures. Their phase shift and attenuation accuracy indicators directly affect the core performance such as beam scanning accuracy. Phase shift and attenuation circuits greatly affect the cost of large-scale phased array transceiver systems and the like.

Traditional passive phase shift circuits are commonly implemented by means of high- and low-pass networks with metal-oxide-semiconductor field-effect transistors (MOSFETs), and traditional attenuation circuits are commonly implemented by means of cascaded resistor networks. For example, a 6-bit phase shift and 6-bit attenuation circuit needs to be implemented with 6-bit phase shift unit circuits and 6-bit attenuation unit circuits, and then parameters are optimized in a specific frequency band to achieve high-precision phase shift and attenuation characteristics. However, this method has the following main problems.

(1) The unit circuits required to be set in multiple, and the phase shift-attenuation circuit structure cannot be reused, resulting in a large circuit size, thus limiting the improvement of circuit integration and increasing link complexity.

(2) In the amplitude-phase control system, phase shift and attenuation circuits need to be cascaded, which increases the circuit insertion loss, thereby reducing circuit efficiency.

(3) Due to the poor parasitic characteristics in separate phase shift and attenuation circuits, additional circuits are required to supplement the circuit parasitic effects, which increases the circuit complexity.

In the prior art, Chinese Patent Publication No. CN110854482A disclosed a high-frequency switch-type phase shifter adopting a high-pass direct phase shifter to achieve the phase shift function, which did not have an amplitude control function. Chinese Patent Publication No. CN112201961A disclosed a dual-function metasurface integrated device based on amplitude and phase modulation. This scheme relies on the modulation of polarized waves to achieve signal modulation, which is directed to modulation at electromagnetic field level rather than the circuit level.

SUMMARY

An object of the disclosure is to provide a high- and low-pass network circuit with integrated amplitude-phase modulation that can realize integrated modulation of the amplitude and phase of a circuit.

In order to achieve the above object, the following technical solutions are adopted.

In a first aspect, this application provides a high- and low-pass network circuit with integrated amplitude-phase modulation, comprising:

- a high- and low-pass network phase-shift unit circuit;
- a first amplitude modulation unit subcircuit;
- a second amplitude modulation unit subcircuit;
- a third amplitude modulation unit subcircuit; and
- a fourth amplitude modulation unit subcircuit;
- wherein the high- and low-pass network phase-shift unit circuit comprises a high-pass network subcircuit and a low-pass network subcircuit; a first end of the high-pass network subcircuit is connected to a first end of the low-pass network subcircuit through a first phase modulation switch transistor and a second phase modulation switch transistor, and a second end of the high-pass network subcircuit is connected to a second end of the low-pass network subcircuit through a third phase modulation switch transistor and a fourth phase modulation switch transistor;
- a bulk terminal of the first phase modulation switch transistor is connected to a bulk terminal of the third phase modulation switch transistor sequentially through the first amplitude modulation unit subcircuit and the second amplitude modulation unit subcircuit; a bulk terminal of the second phase modulation switch transistor is connected to a bulk terminal of the fourth phase modulation switch transistor through the third amplitude modulation unit subcircuit and the fourth amplitude modulation unit subcircuit; and
- each of the first amplitude modulation unit subcircuit, the second amplitude modulation unit subcircuit, the third amplitude modulation unit subcircuit and the fourth amplitude modulation unit subcircuit comprises an amplitude modulation switch transistor and a resistor connected in parallel.

In some embodiments, the high-pass network subcircuit comprises a first capacitor, an inductor and a second capacitor; the first capacitor is connected in series with the second capacitor, and the first capacitor and the second capacitor are connected between a drain of the first phase modulation switch transistor and a drain of the third phase modulation switch transistor; and a first end of the inductor is connected between the first capacitor and the second capacitor, and a second end of the inductor is connected to ground.

In some embodiments, the low-pass network subcircuit comprises a first inductor, a second inductor, a first capacitor, a second capacitor and a third capacitor; the first inductor is connected in series with the second inductor, and the first inductor and the second inductor are connected between a drain of the second phase modulation switch transistor and a drain of the fourth phase modulation switch transistor; and a first end of the first capacitor is connected between the drain of the second phase modulation switch transistor and the first inductor; a first end of the second capacitor is connected between the drain of the fourth phase modulation switch transistor and the second inductor; a first end of the third capacitor is connected between the first inductor and the second inductor; and a second end of each of the first capacitor, the second capacitor and the third capacitor is connected to ground.

In some embodiments, a source of the first phase modulation switch transistor is connected to a source of the second phase modulation switch transistor; and a source of the third phase modulation switch transistor is connected to a source of the fourth phase modulation switch transistor.

In some embodiments, the resistor is connected in parallel between a source and a drain of the amplitude modulation switch transistor; a connection point between the resistor and the source of the amplitude modulation switch transistor in the first amplitude modulation unit subcircuit is connected to the first phase modulation switch transistor; a connection point between the resistor and the source of the amplitude modulation switch transistor in the second amplitude modulation unit subcircuit is connected to the third phase modulation switch transistor; a connection point between the resistor and the source of the amplitude modulation switch transistor in the third amplitude modulation unit subcircuit is connected to the second phase modulation switch transistor; a connection point between the resistor and the source of the amplitude modulation switch transistor in the fourth amplitude modulation unit subcircuit is connected to the fourth phase modulation switch transistor; and a connection point between the resistor and the drain of the amplitude modulation switch transistor is connected to ground.

In some embodiments, the first amplitude modulation unit subcircuit, the second amplitude modulation unit subcircuit, the third amplitude modulation unit subcircuit and the fourth amplitude modulation unit subcircuit are embedded in the high- and low-pass network phase-shift unit circuit by means of a complementary metal-oxide semiconductor (CMOS) technology.

In some embodiments, the resistor has a resistance value of ≥5 kΩ.

In a second aspect, this application provides a method for controlling the above high- and low-pass network circuit, comprising:

(1) in a phase modulation state, controlling the first phase modulation switch transistor, the second phase modulation switch transistor, the third phase modulation switch transistor and the fourth phase modulation switch transistor to achieve switching between high pass and low pass to change a phase state; and (2) in an amplitude modulation state, controlling an on-off state of the amplitude modulation switch transistor such that a grounding resistance of the bulk terminal of each of the first phase modulation switch transistor, the second phase modulation switch transistor, the third phase modulation switch transistor and the fourth phase modulation switch transistor is switched between a high-resistance state and a low-resistance state to modulate an amplitude state.

In some embodiments, step (1) is performed through steps of:

inputting a first control signal to a gate of each of the first phase modulation switch transistor and the third phase modulation switch transistor, and inputting a second control signal to a gate of each of the second phase modulation switch transistor and the fourth phase modulation switch transistor, wherein the first control signal and the second control signal are inverse to each other;

if the first control signal is in a high-level state, turning on the first phase modulation switch transistor and the third phase modulation switch transistor, and turning off the second phase modulation switch transistor and the fourth phase modulation switch transistor, such that a radio frequency signal is transmitted via the high-pass network subcircuit; and if the first control signal is in a low-level state, turning on the second phase modulation switch transistor and the fourth phase modulation switch transistor, and turning off the first phase modulation switch transistor and the third phase modulation switch transistor, such that the first control signal is transmitted via the low-pass network subcircuit.

In some embodiments, step (2) is performed through steps of:

inputting a first signal to the amplitude modulation switch transistor in the first amplitude modulation unit subcircuit connected to the bulk terminal of the first phase modulation switch transistor and the amplitude modulation switch transistor in the second amplitude modulation unit subcircuit connected to the bulk terminal of the second phase modulation switch transistor; and inputting a second signal to the amplitude modulation switch transistor in the third amplitude modulation unit subcircuit connected to the bulk terminal of the third phase modulation switch transistor and the amplitude modulation switch transistor in the fourth amplitude modulation unit subcircuit connected to the bulk terminal of the fourth phase modulation switch transistor;

wherein if the first signal and the second signal are in a low-level state, the grounding resistance of the bulk terminal of each of the first phase modulation switch transistor, the second phase modulation switch transistor, the third phase modulation switch transistor and the fourth phase modulation switch transistor is in the high-resistance state;

if the first signal is in a high-level state, and the second signal is in the low-level state, the grounding resistance of the bulk terminal of each of the first phase modulation switch transistor and the third phase modulation switch transistor is in the low-resistance state, and the grounding resistance of the bulk terminal of each of the second phase modulation switch transistor and the fourth phase modulation switch transistor is in the high-resistance state; and if the first signal and the second signal are in the high-level state, the grounding resistance of the bulk terminal of each of the first phase modulation switch transistor, the second phase modulation switch transistor, the third phase modulation switch transistor and the fourth phase modulation switch transistor is in the low-resistance state.

In some embodiments, the method further comprises:

adjusting parameters of each of the first phase modulation switch transistor, the second phase modulation switch transistor, the third phase modulation switch transistor and the fourth phase modulation switch transistor, inductor parameters and capacitor parameters, such that within a 9-10 GHz transmission frequency band, a phase difference remains constant, and an amplitude characteristic difference is close to zero; and adjusting parameters of the amplitude modulation switch transistor and the resistor in each of the first amplitude modulation unit subcircuit, the second amplitude modulation unit subcircuit, the third amplitude modulation unit subcircuit and the fourth amplitude modulation unit subcircuit such that within the 9-10 GHz transmission frequency band, IL2-IL1 and IL3-IL1 are constant values, and PH2-PH1 and PH3-PH1 are close to zero; wherein IL1 is a signal transmission loss in a case where the first signal and the second signal are in the low-level state, IL2 is a signal transmission loss in a case where the first signal is in the high-level state and the second signal is in the low-level state, IL3 is a signal transmission loss in a case where the first signal and the second signal are in the high-level state, PH1 is a signal transmission phase in the case where the first signal and the second signal are in the low-level state, PH2 is a signal transmission phase in the case where the first signal is in the high-level state and the second signal is in the low-level state, and PH3 is a signal transmission phase in the case where the first signal and the second signal are in the high-level state.

Compared to the prior art, the present disclosure has the following beneficial effects.

(1) In the present disclosure, a high- and low-pass network phase-shift unit circuit and amplitude modulation unit subcircuits are set in the same unit structure to simultaneously realize modulation of amplitude and phase. In addition, the amplitude modulation unit subcircuits include amplitude modulation switch transistors and resistors, resulting in a small size, which solves the problem of non-reusability existing in traditional passive phase shift attenuation circuits.

(2) The present disclosure can additionally realize the amplitude modulation function while keeping the unit size of the phase shifter unchanged.

(3) In the amplitude modulation state, the power level of the radio frequency signal leakage from the bulk terminal of the phase modulation switch transistors is modulated. Since changing the grounding resistance state of the bulk terminal of the phase modulation switch transistors leads to small phase parasitic value, the phase parasitic can be maintained at a low level during the amplitude modulation process.

(4) In the phase modulation state, the switching between high pass and low pass is achieved by means of the phase modulation switch transistors, so as to change the phase state. This can achieve accurate phase modulation and low amplitude parasitic.

Other aspects and advantages of the present disclosure will be described, in part, in the following description, and will become obvious, in part, from the following description, or may be learned through the practice of the present disclosure.

DETAILED DESCRIPTION OF EMBODIMENTS

In order to make the purpose, technical solutions and advantages of the embodiments of the present disclosure clearer, the technical solutions in the embodiments of the present disclosure will be clearly and completely described below. Obviously, the described embodiments are merely some of the embodiments of the disclosure, rather than all embodiments. Based on the embodiments of the disclosure, all other embodiments obtained by those of ordinary skill in the art without creative efforts shall fall within the scope of the disclosure defined by the appended claims.

Figure 1:
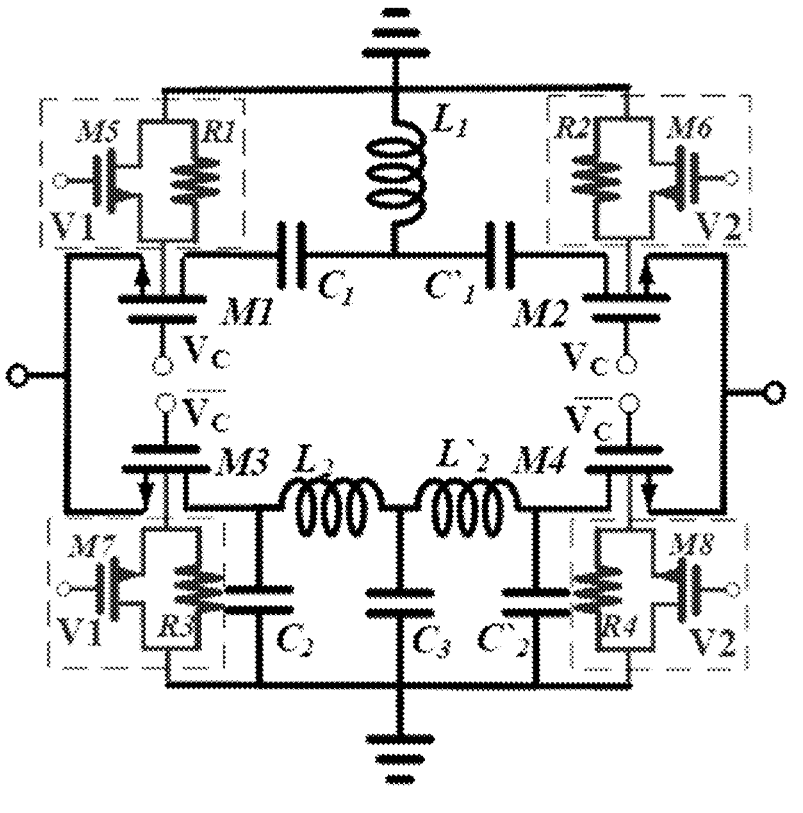
FIG. 1 is a structural diagram of a high- and low-pass network circuit with integrated amplitude-phase modulation in accordance with an embodiment of the present disclosure.
Figure 2A:
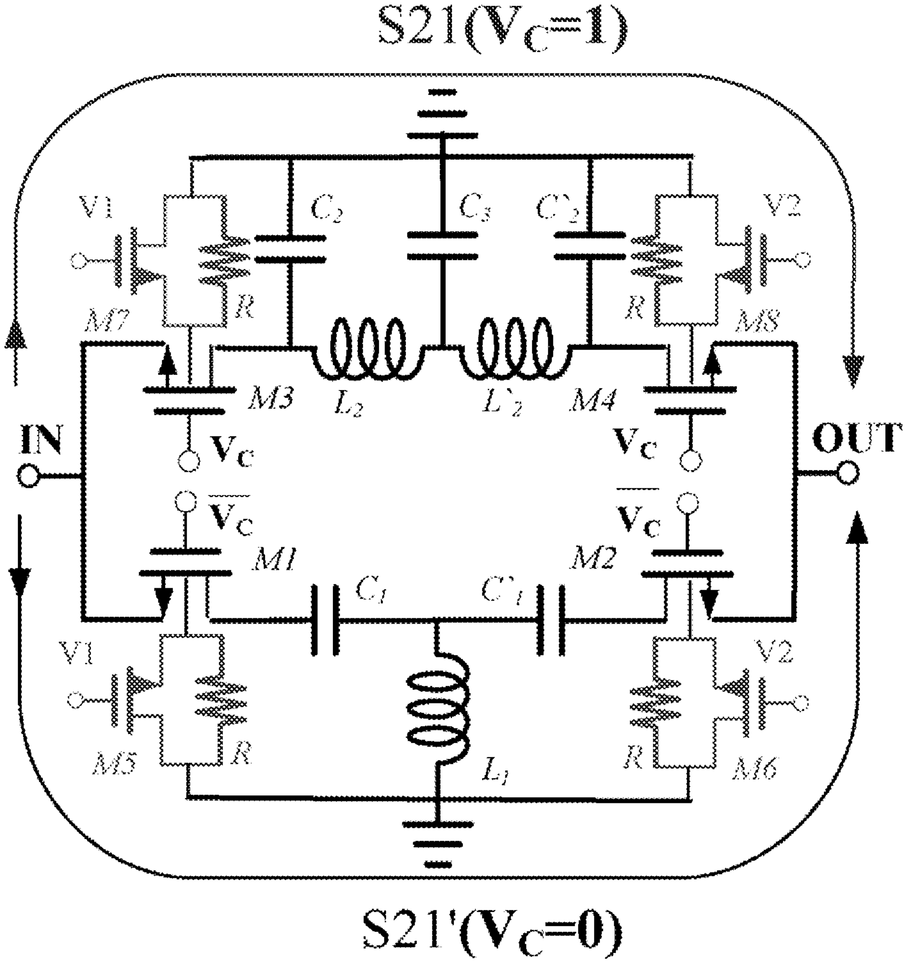
FIG. 2*a* is a schematic diagram of a circuit principle of the high- and low-pass network circuit in accordance with an embodiment of the present disclosure.
Figure 2B:
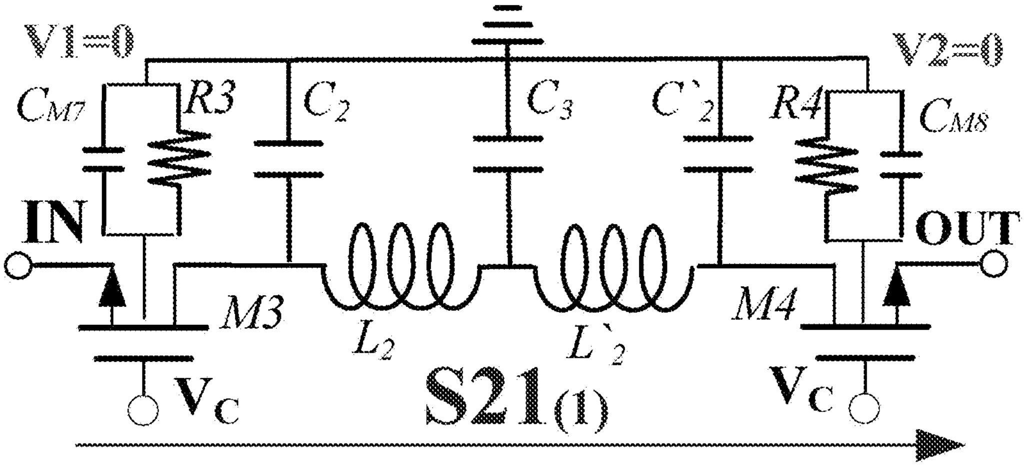
FIG. 2*b* is a schematic diagram of a circuit principle in a case where a control signal Vc=1, a signal V1=0, and a signal V2=0.
Figure 2C:
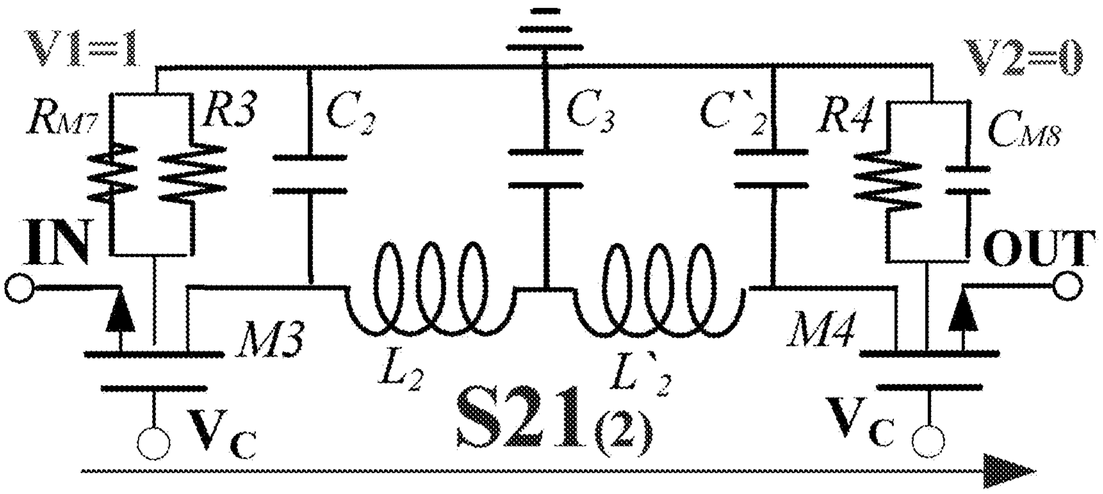
FIG. 2*c* is a schematic diagram of a circuit principle in a case where Vc=1, V1=1, and V2=0.
Figure 2D:
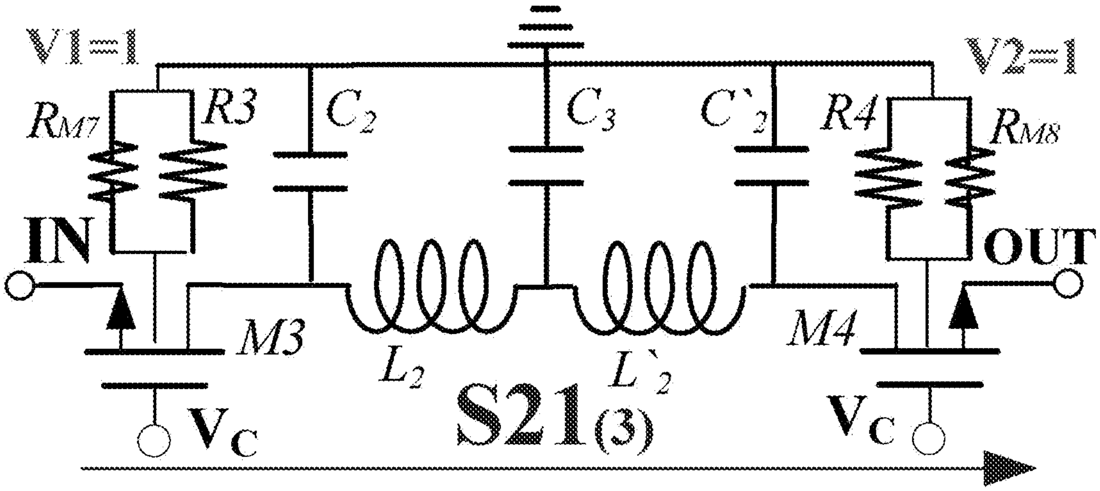
FIG. 2*d* is a schematic diagram of a circuit principle in a case where Vc=1, V1=1, and V2=1.

As shown in FIG. 1, a high- and low-pass network circuit with integrated amplitude-phase modulation is provided, which includes a high- and low-pass network phase-shift unit circuit and a plurality of amplitude modulation unit subcircuits. The high- and low-pass network phase-shift unit circuit includes a high-pass network subcircuit and a low-pass network subcircuit. A first end of the high-pass network subcircuit is connected to a first end of the low-pass network subcircuit through phase modulation switch transistors M1 and M3. A second end of the high-pass network subcircuit is connected to a second end of the low-pass network subcircuit through phase modulation switch transistors M2 and M4. A bulk terminal of the phase modulation switch transistor M1 is connected to a bulk terminal of the phase modulation switch transistor M2 sequentially through two amplitude modulation unit subcircuits. A bulk terminal of the phase modulation switch transistor M3 is connected to a bulk terminal of the phase modulation switch transistor M4 sequentially through another two amplitude modulation unit subcircuits. Each of the plurality of amplitude modulation unit subcircuits includes an amplitude modulation switch transistor and a resistor, and the amplitude modulation switch transistor is connected in parallel to the resistor.

Specifically, in a phase modulation state, the phase state is changed by controlling the on-off state of each phase modulation switch transistor to realize the switching between the high-pass network and the low-pass network. In an amplitude modulation state, the grounding resistance of the bulk terminal of the amplitude modulation switch transistor connected to the bulk terminal of each phase modulation switch transistor is controlled to switch between high- and low-resistance states to realize the modulation of amplitude state. In this embodiment, high-precision modulation of amplitude and phase is achieved simultaneously in the same unit structure, which solves the problem of non-reusability existing in traditional passive phase shift attenuation circuits.

In an embodiment, the high-pass network subcircuit includes a capacitor C1, an inductor L1 and a capacitor C1'. The capacitor C1 is connected in series with the capacitor C1'. The capacitor C1 and the capacitor C1' are connected between a drain of the phase modulation switch transistor M1 and a drain of the phase modulation switch transistor M2. A first end of the inductor L1 is connected between the capacitor C1 and the capacitor C1', and a second end of the inductor L1 is connected to ground.

It can be seen that the high-pass network subcircuit is defined as a T-type architecture composed of series capacitor-parallel grounded inductor-series capacitor, and also includes multi-stage series structure of this configuration. Specifically, the bulk terminal of the phase modulation switch transistor M1 is connected to a first amplitude modulation unit subcircuit, and the bulk terminal of the phase modulation switch transistor M2 is connected to a second amplitude modulation unit subcircuit. The first amplitude modulation unit subcircuit includes an amplitude modulation switch transistor M5 and a grounding resistor R1. The second amplitude modulation unit subcircuit includes an amplitude modulation switch transistor M6 and a grounding resistor R2. The grounding resistor R1 is connected in parallel between a source and a drain of the amplitude modulation switch transistor M5. A connection point between the grounding resistor R1 and the source of the amplitude modulation switch transistor M5 is connected to the bulk terminal of the phase modulation switch transistor M1. The grounding resistor R2 is connected in parallel between a source and a drain of the amplitude modulation switch transistor M6. A connection point between the grounding resistor R2 and the source of the amplitude modulation switch transistor M6 is connected to the bulk terminal of the phase modulation switch transistor M2. A connection point between the grounding resistor R1 and the drain of the amplitude modulation switch transistor M5 is connected to a connection point between the grounding resistor R2 and the drain of the amplitude modulation switch transistor M6 and then connected to ground.

In an embodiment, the low-pass network subcircuit includes an inductor L2, an inductor L2', a capacitor C2, a capacitor C2' and a capacitor C3. The inductor L2 is connected in series with the inductor L2'. The inductor L2 and the inductor L2' are connected between a drain of the phase modulation switch transistor M3 and a drain of the phase modulation switch transistor M4. A first end of the capacitor C2 is connected between the drain of the phase modulation switch transistor M3 and the inductor L2. A first end of the capacitor C2' is connected between the drain of the phase modulation switch transistor M4 and the inductor L2'. A first end of the capacitor C3 is connected between the inductor L2 and the inductor L2'. A second end of each of the capacitor C2, the capacitor C2' and the capacitor C3 is connected to ground.

It can be seen that the low-pass network subcircuit is defined as a T-type architecture composed of parallel grounded capacitor-series inductor-parallel grounded capacitor-series inductor-parallel grounded capacitor, and also includes the multi-stage series structure of this configuration. Specifically, the bulk terminal of the phase modulation switch transistor M3 is connected to a third amplitude modulation unit subcircuit, and the bulk terminal of the phase modulation switch transistor M4 is connected to a fourth amplitude modulation unit subcircuit. The third amplitude modulation unit subcircuit includes an amplitude modulation switch transistor M7 and a grounding resistor R3. The grounding resistor R3 is connected in parallel between a source and a drain of the amplitude modulation switch transistor M7. A connection point between the grounding resistor R3 and the source of the amplitude modulation switch transistor M7 is connected to the bulk terminal of the phase modulation switch transistor M3. The fourth amplitude modulation unit subcircuit includes an amplitude modulation switch transistor M8 and a grounding resistor R4. The grounding resistor R4 is connected in parallel between a source and a drain of the amplitude modulation switch transistor M8. A connection point between the grounding resistor R4 and the source of the amplitude modulation switch transistor M8 is connected to the bulk terminal of the phase modulation switch transistor M4. A connection point between the grounding resistor R3 and the drain of the amplitude modulation switch transistor M7 is connected to a connection point between the grounding resistor R4 and the drain of the amplitude modulation switch transistor M8 and then connected to ground.

In an embodiment, resistance values of the grounding resistors R1-R4 are all ≥5 kΩ.

It should be noted that in actual applications, the grounding resistors R1-R4 are generally required to be set with large resistance values (e.g., ≥5 kΩ, so that the attenuation function can be realized when the amplitude modulation switch transistors M5, M6, M7 and M8 are switched between on and off states. In the subsequent simulation, the resistance values are set to 10 kΩ to realize the attenuation function with a 2-digit 0.5 dB step. If the grounding resistors are set with small resistance values, the corresponding attenuation value achieved in this case tends to be quite small, or even in the limit case where the resistance values are 0, the attenuation function cannot be realized.

In an embodiment, a source of the phase modulation switch transistor M1 is connected to a source of the phase modulation switch transistor M3. A source of the phase modulation switch transistor M2 is connected to a source of the phase modulation switch transistor M4.

It should be noted that in the amplitude modulation state, the power level of the radio frequency signal leakage from the bulk terminal of the phase modulation switch transistors is modulated. Since changing the grounding resistance state of the bulk terminal of the phase modulation switch transistors leads to small phase parasitic value, the phase parasitic can be maintained at a low level during the amplitude modulation process. In the phase modulation state, the switching between high pass and low pass is achieved by means of the phase modulation switch transistors to change the phase state, thereby achieving accurate phase modulation and low amplitude parasitic.

In an embodiment, the plurality of amplitude modulation unit subcircuits are embedded in the high- and low-pass network circuit by means of a complementary metal-oxide semiconductor (CMOS) technology.

It should be noted that by virtue of the CMOS process, the amplitude modulation function can be additionally realized while the size of the phase shifter unit remains unchanged.

Figure 3:
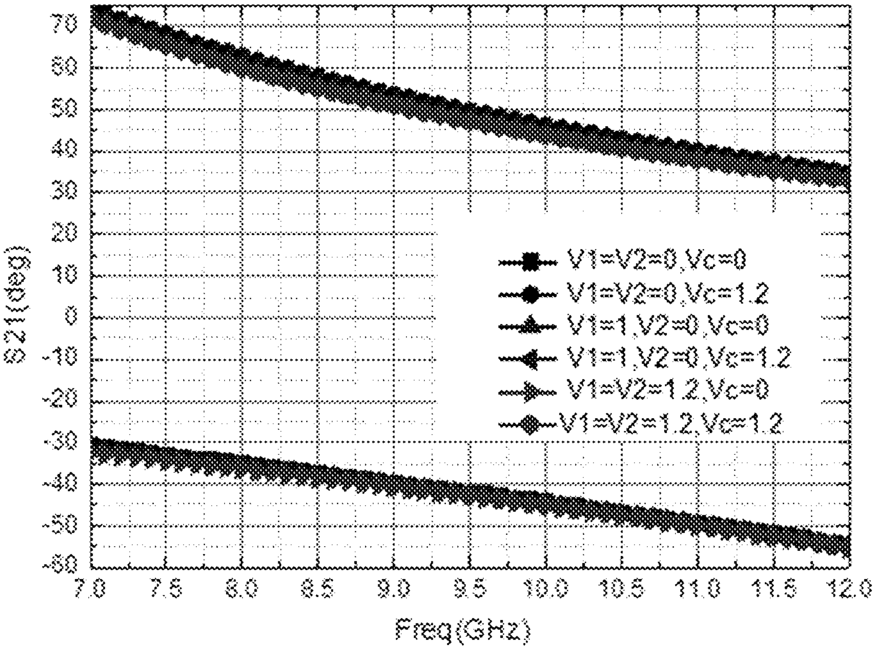
FIG. 3 shows simulation results of phase shift characteristics of the high- and low-pass network circuit in accordance with an embodiment of the present disclosure.

Furthermore, as shown in FIG. 3, for the high- and low-pass network circuit provided herein, the phase state is changed by switching between high and low passes be means of the phase modulation switch transistors, so as to realize a 180° phase shift within a 9-10 GHz transmission frequency band. Specifically, as shown in FIG. 1, the control signals Vc and $\overline{Vc}$ are inverse to each other. In a case where the control signal Vc is in a high-level state, the phase modulation switch transistors M1 and M2 are turned on, and the phase modulation switch transistors M3 and M4 are turned off, such that the control signal Vc is transmitted by a high-pass network subcircuit consisting of C1, C1' and L1. In a case where the control signal Vc is in a low-level state, the phase modulation switch transistors M3 and M4 are turned on, and the phase modulation switch transistors M1 and M2 are turned off, such that the control signal Vc is transmitted by a low-pass network subcircuit consisting of C2, C2', C3, L2 and L2'. The two transmission cases have different signal transmission phase and amplitude characteristics. Specifically, the high-level state refers to a condition where a voltage is higher than a transistor gate turn-on voltage, and the low-level state refers to a condition where a voltage is higher than a transistor turn-off voltage.

Figure 4:
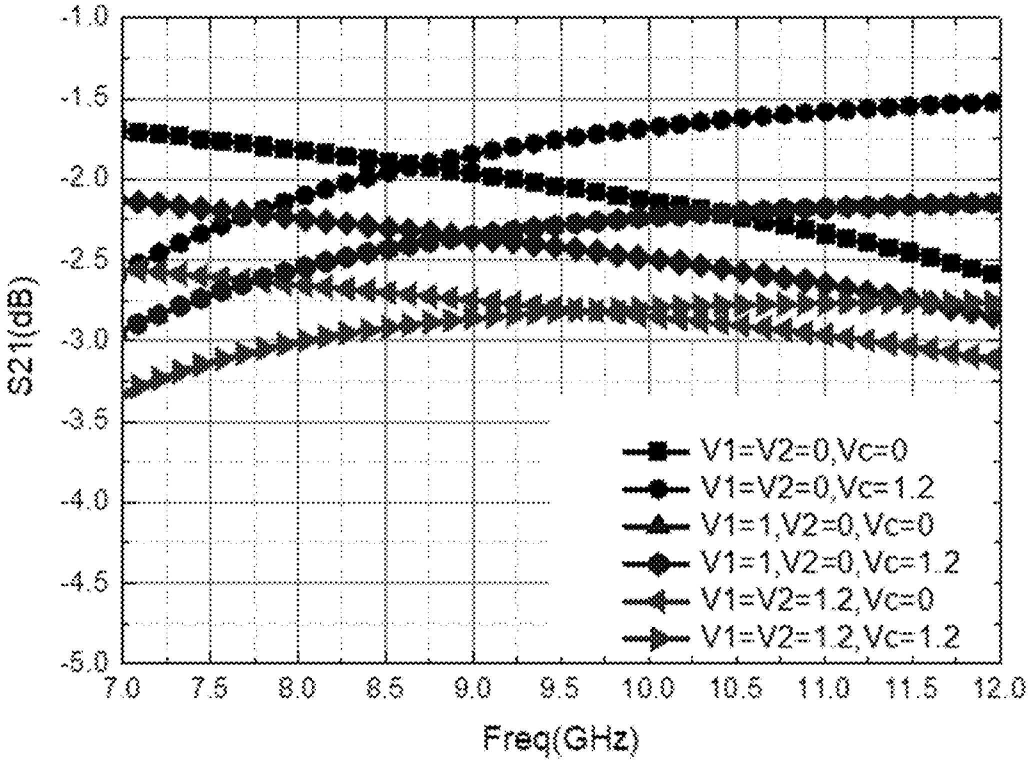
FIG. 4 shows simulation results of attenuation characteristics of the high- and low-pass network circuit in accordance with an embodiment of the present disclosure.

As shown in FIG. 4, the high- and low-pass network circuit provided herein can realize 0.5 dB and 1 dB 2-digit step attenuation modulation within the range of 9-10 GHz. The circuit is implemented as follows. Grounding resistances R of the bulk terminal of the phase modulation switch transistors M1, M2, M3 and M4 refer to a resistance value of the corresponding amplitude modulation switch transistor and grounding resistor connected in parallel as a whole. As shown in FIGS. 1 and 2*a-d*, in a case of signals V1 and V2 are in a low-level state, the amplitude modulation switch transistors M5, M6, M7 and M8 are all in the off state, and the grounding resistance R (R=5 kΩ of the bulk terminal of the phase modulation switch transistors M1, M2, M3 and M4 is in a high-resistance state. In this case, the signal transmission insertion loss is IL1, and the transmission phase is PH1. In a case where the signal V1 is in a high-level state and the signal V2 is in a low-level state, the amplitude modulation switch transistors M5 and M6 are in the on state, the grounding resistance R of the bulk terminal of the phase modulation switch transistors M1 and M2 is a small on-state resistance, which corresponds to a low-resistance state. The grounding resistance of the bulk terminal of the phase modulation switch transistors M3 and M4 corresponds to the high-resistance state. In this case, the signal transmission insertion loss is IL2, and the transmission phase is PH2. In a case where the signals V1 and V2 are in a high-level state, the amplitude modulation switch transistors M5, M6, M7 and M8 are all in the on state, the grounding resistance R of the bulk terminal of the phase modulation switch transistors M1, M2, M3 and M4 to ground is a small on-state resistance in parallel with the switch transistors, which is in the a low-resistance state. In this case, the signal transmission insertion loss is IL3, and the transmission phase is PH3.

Figure 5:
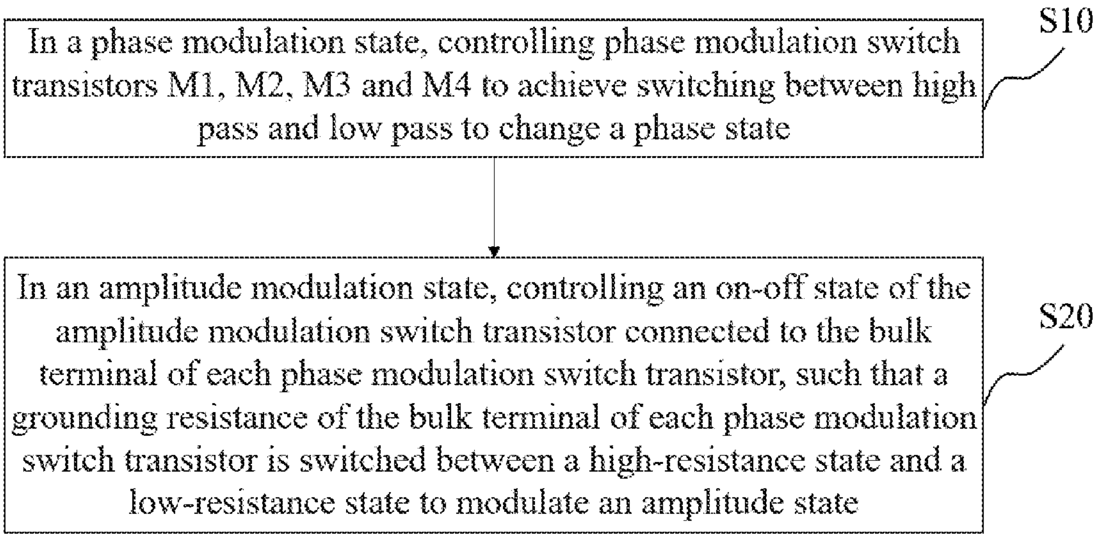
FIG. 5 is a flow chart of a method for controlling the high- and low-pass network circuit in accordance with an embodiment of the present disclosure.

Moreover, as shown in FIG. 5, a method for controlling the above high- and low-pass network circuit is provided, which includes the following steps.

(S10) In a phase modulation state, the phase modulation switch transistors M1, M2, M3 and M4 are controlled such that the switching between high-pass and low-pass is realized to change the phase state.

(S20) In an amplitude modulation state, the on-off state of the amplitude modulation switch transistor connected to the bulk terminal of each phase modulation switch transistor is controlled, such that the grounding resistance of the bulk terminal is controlled to switch between high- and low-resistance states to achieve the amplitude modulation. In the present disclosure, the high-resistance state is defined as a state of ≥5 kΩ, and the low-resistance state is defined as a state of ≤100Ω.

In an embodiment, step (S10) is performed through the following steps.

A control signal Vc is input to gates of the phase modulation switch transistors M1 and M2, and a control signal $\overline{Vc}$ is input to gates of the phase modulation switch transistors M3 and M4, where Vc and $\overline{Vc}$ are inverse to each other.

If the control signal Vc is in a high-level state, the phase modulation switch transistors M1 and M2 are turned on, and the phase modulation switch transistors M3 and M4 are turned off, such that a radio frequency signal is transmitted via the high-pass network subcircuit.

If the control signal Vc is in a low-level state, the phase modulation switch transistors M3 and M4 are turned on, and the phase modulation switch transistors M1 and M2 are turned off, such that the control signal Vc is transmitted via the low-pass network subcircuit.

In an embodiment, step (S20) is performed through the following steps.

A signal V1 is input to the amplitude modulation switch transistor connected to the bulk terminal of the phase modulation switch transistor M1 and the amplitude modulation switch transistor connected to the bulk terminal of the phase modulation switch transistor M3. A signal V2 is input to the amplitude modulation switch transistor connected to the bulk terminal of the phase modulation switch transistor M2 and the amplitude modulation switch transistor connected to the bulk terminal of the phase modulation switch transistor M4.

If the signals V1 and V2 are both in a low-level state, a grounding resistance of the bulk terminal of the phase modulation switch transistors M1, M2, M3 and M4 is in a high-resistance state.

If the signal V1 is in a high-level state, and the signal V2 is in a low-level state, the grounding resistance of the bulk terminal of the phase modulation switch transistors M1 and M2 is in a low-resistance state, and the grounding resistance of the bulk terminal of the phase modulation switch transistors M3 and M4 to ground is in a high-resistance state.

If the signals V1 and V2 are both in a high-level state, the grounding resistance of the bulk terminal of the phase modulation switch transistors M1, M2, M3 and M4 is in a low-resistance state.

Specifically, in the case where the signals V1 and V2 are both in the low-level state, the amplitude modulation switch transistors M5, M6, M7 and M8 are all in the off state, the grounding resistance of the bulk terminal of the phase modulation switch transistors M1, M2, M3 and M4 is R (R≥5 kΩ. The grounding resistance of the bulk terminal of the phase modulation switch transistors M1, M2, M3 and M4 are all in the high-resistance state. In this case, the signal transmission insertion loss is IL1, and the transmission phase is PH1. In the case where the signal V1 is in the high-level state, and the signal V2 is in the low-level state, the amplitude modulation switch transistors M5 and M6 are in the on state, the amplitude modulation switch transistors M7 and M8 are in the off state, the grounding resistance of the bulk terminal of the phase modulation switch transistors M1 and M2 are R1 and R2, respectively, which is the small on-state resistance in parallel with the switch transistors, indicating the low-resistance state. The grounding resistance of the bulk terminal of the phase modulation switch transistors M3 and M4 is in the high-resistance state. In this case, the signal transmission insertion loss is IL2, and the transmission phase is PH2. In the case where the signals V1 and V2 are both in the high-level state, the amplitude modulation switch transistors M5, M6, M7 and M8 are all in the on state, the grounding resistance of the bulk terminal of the phase modulation switch transistors M1, M2, M3 and M4 is the small on-state resistance formed by connecting corresponding grounding resistor in parallel with the switch transistors, indicating the low-resistance state. In this case, the signal transmission insertion loss is IL3, and the transmission phase is PH3.

In an embodiment, the method further includes the following steps.

Parameters of the phase modulation switch transistors, the inductors and the capacitors are adjusted, such that within the 9-10 GHz transmission frequency band, a phase difference remains constant, and an amplitude characteristic difference is close to zero.

Parameters of the amplitude modulation switch transistors and the resistors in each amplitude modulation unit subcircuit are adjusted, such that within the 9-10 GHz transmission frequency band, IL2-IL1, IL3-IL1 are constant values, and PH2-PH1, PH3-PH1 are close to zero.

Specifically, in this embodiment, with respect to the optimization of the parameters of the phase modulation switch transistors M1, M2, M3 and M4, inductor parameters and capacitor parameters, the gate length is 130 nm, the gate width is 72 μm, C1=400 fF, L1=780 pH, C2=160 fF, C3=320 fF, and L2=590 pH, such that within the 9-10 GHz transmission frequency band, the phase difference is maintained at 180°, and the amplitude characteristic difference is close to zero.

With respect to the optimization of the parameters of the grounding resistors and the amplitude modulation switch transistors M5, M6, M7 and M8, the gate length is 130 nm, the gate width is 24 μm, and R1, R2, R3 and R4 are 10 kΩ, such that within the 9-10 GHz transmission frequency band, L2-IL1=0.5 dB, IL3-IL1=1 dB, and PH2-PH1 and PH3-PH1 are close to zero.

In the description of this application, descriptions related to terms such as "an embodiment", "some embodiments", "examples", "specific examples" and "some examples" indicate that specific features, structures, materials, or characteristics described in conjunction with the embodiment or example are included in at least one embodiment or example of the present disclosure. In the specification, schematic representations of the above terms do not necessarily refer to the same embodiment or example, the specific features, structures, materials or characteristics described herein can be combined with each other in any one or more embodiments or examples in a suitable manner.

In addition, relational terms such as "first" and "second" are only descriptive, and cannot be understood as indicating or implying relative importance or implicitly indicating the number of indicated technical features. Therefore, features defined as "first" and "second" can explicitly or implicitly include at least one of the features. In the description of this application, "a plurality of" means at least two, such as two, three, etc., unless otherwise expressly and specifically limited.

Although the embodiments of the present disclosure have been disclosed and described above, it should be understood that the embodiments described above are merely illustrative of the present application, and are not intended to limit the scope of the present application. Changes, modifications, replacements and variations made by those of ordinary skill in the art without departing from the principles and purposes of the present disclosure shall fall within the scope of the disclosure defined by the appended claims.

What is claimed is:

1. A high- and low-pass network circuit with integrated amplitude-phase modulation, comprising:

a high- and low-pass network phase-shift unit circuit; and amplitude modulation unit subcircuits;

wherein the high- and low-pass network phase-shift unit circuit comprises a high-pass network subcircuit and a low-pass network subcircuit; a first end of the high-pass network subcircuit is connected to a first end of the low-pass network subcircuit through a first phase modulation switch transistor and a second phase modulation switch transistor, and a second end of the high-pass network subcircuit is connected to a second end of the low-pass network subcircuit through a third phase modulation switch transistor and a fourth phase modulation switch transistor;

a bulk terminal of the first phase modulation switch transistor is connected to a bulk terminal of the third phase modulation switch transistor through two of the amplitude modulation unit subcircuits; a bulk terminal of the second phase modulation switch transistor is connected to a bulk terminal of the fourth phase modulation switch transistor through other two of the amplitude modulation unit subcircuits; and each of the amplitude modulation unit subcircuits comprises an amplitude modulation switch transistor and a resistor connected in parallel.

2. The high- and low-pass network circuit of claim 1, wherein the high-pass network subcircuit comprises a first capacitor, an inductor and a second capacitor; the first capacitor is connected in series with the second capacitor, and the first capacitor and the second capacitor are connected between a drain of the first phase modulation switch transistor and a drain of the third phase modulation switch transistor; and a first end of the inductor is connected between the first capacitor and the second capacitor, and a second end of the inductor is connected to ground.

3. The high- and low-pass network circuit of claim 1, wherein the low-pass network subcircuit comprises a first inductor, a second inductor, a first capacitor, a second capacitor and a third capacitor; the first inductor is connected in series with the second inductor, and the first inductor and the second inductor are connected between a drain of the second phase modulation switch transistor and a drain of the fourth phase modulation switch transistor; and a first end of the first capacitor is connected between the drain of the second phase modulation switch transistor and the first inductor; a first end of the second capacitor is connected between the drain of the fourth phase modulation switch transistor and the second inductor; a first end of the third capacitor is connected between the first inductor and the second inductor; and a second end of each of the first capacitor, the second capacitor and the third capacitor is connected to ground.

4. The high- and low-pass network circuit of claim 1, wherein a source of the first phase modulation switch transistor is connected to a source of the second phase modulation switch transistor; and a source of the third phase modulation switch transistor is connected to a source of the fourth phase modulation switch transistor.

5. The high- and low-pass network circuit of claim 1, wherein the resistor is connected in parallel between a source and a drain of the amplitude modulation switch transistor;

a connection point between the resistor and the source of the amplitude modulation switch transistor in each of the amplitude modulation unit subcircuits is connected to each of the first phase modulation switch transistor, the second phase modulation switch transistor, the third phase modulation switch transistor and the fourth phase modulation switch transistor; and a connection point between the resistor and the drain of the amplitude modulation switch transistor is connected to ground.

6. The high- and low-pass network circuit of claim 1, wherein the amplitude modulation unit subcircuits are embedded in the high- and low-pass network phase-shift unit circuit by means of a complementary metal-oxide semiconductor (CMOS) technology.

7. A method for controlling the high- and low-pass network circuit of claim 1, comprising:

(1) in a phase modulation state, controlling the first phase modulation switch transistor, the second phase modulation switch transistor, the third phase modulation switch transistor and the fourth phase modulation switch transistor to achieve switching between high pass and low pass to change a phase state; and (2) in an amplitude modulation state, controlling an on-off state of the amplitude modulation switch transistor such that a grounding resistance of the bulk terminal of each of the first phase modulation switch transistor, the second phase modulation switch transistor, the third phase modulation switch transistor and the fourth phase modulation switch transistor is switched between a high-resistance state and a low-resistance state to modulate an amplitude state.

8. The method of claim 7, wherein step (1) is performed through steps of:

inputting a first control signal to a gate of each of the first phase modulation switch transistor and the third phase modulation switch transistor, and inputting a second control signal to a gate of each of the second phase modulation switch transistor and the fourth phase modulation switch transistor, wherein the first control signal and the second control signal are inverse to each other;

if the first control signal is in a high-level state, turning on the first phase modulation switch transistor and the third phase modulation switch transistor, and turning off the second phase modulation switch transistor and the fourth phase modulation switch transistor, such that a radio frequency signal is transmitted via the high-pass network subcircuit; and if the first control signal is in a low-level state, turning on the second phase modulation switch transistor and the fourth phase modulation switch transistor, and turning off the first phase modulation switch transistor and the third phase modulation switch transistor, such that the first control signal is transmitted via the low-pass network subcircuit.

9. The method of claim 7, wherein step (2) is performed through steps of:

inputting a first signal to the amplitude modulation switch transistor in the amplitude modulation unit subcircuit connected to the bulk terminal of the first phase modulation switch transistor and the amplitude modulation switch transistor in the amplitude modulation unit subcircuit connected to the bulk terminal of the second phase modulation switch transistor; and inputting a second signal to the amplitude modulation switch transistor in the amplitude modulation unit subcircuit connected to the bulk terminal of the third phase modulation switch transistor and the amplitude modulation switch transistor in the amplitude modulation unit subcircuit connected to the bulk terminal of the fourth phase modulation switch transistor;

wherein if the first signal and the second signal are in a low-level state, the grounding resistance of the bulk terminal of each of the first phase modulation switch transistor, the second phase modulation switch transistor, the third phase modulation switch transistor and the fourth phase modulation switch transistor is in the high-resistance state;

if the first signal is in a high-level state, and the second signal is in the low-level state, the grounding resistance of the bulk terminal of each of the first phase modulation switch transistor and the third phase modulation switch transistor is in the low-resistance state, and the grounding resistance of the bulk terminal of each of the second phase modulation switch transistor and the fourth phase modulation switch transistor is in the high-resistance state; and if the first signal and the second signal are in the high-level state, the grounding resistance of the bulk terminal of each of the first phase modulation switch transistor, the second phase modulation switch transistor, the third phase modulation switch transistor and the fourth phase modulation switch transistor is in the low-resistance state.

10. The method of claim 9, further comprising:

adjusting parameters of each of the first phase modulation switch transistor, the second phase modulation switch transistor, the third phase modulation switch transistor and the fourth phase modulation switch transistor, inductor parameters and capacitor parameters, such that within a 9-10 GHz transmission frequency band, a phase difference remains constant, and an amplitude characteristic difference is close to zero; and adjusting parameters of the amplitude modulation switch transistor and the resistor in each of the amplitude modulation unit subcircuits such that within the 9-10 GHz transmission frequency band, IL2-IL1 and IL3-IL1 are constant values, and PH2-PH1 and PH3-PH1 are close to zero; wherein IL1 is a signal transmission loss in a case where the first signal and the second signal are in the low-level state, IL2 is a signal transmission loss in a case where the first signal is in the high-level state and the second signal is in the low-level state, IL3 is a signal transmission loss in a case where the first signal and the second signal are in the high-level state, PH1 is a signal transmission phase in the case where the first signal and the second signal are in the low-level state, PH2 is a signal transmission phase in the case where the first signal is in the high-level state and the second signal is in the low-level state, and PH3 is a signal transmission phase in the case where the first signal and the second signal are in the high-level state.

* * * * *